(12) United States Patent
Perera et al.

(10) Patent No.: US 8,828,774 B2
(45) Date of Patent: Sep. 9, 2014

(54) METHOD FOR A SINGLE PRECURSOR IONIC EXCHANGE TO PREPARE SEMICONDUCTOR NANOCRYSTAL N-TYPE THERMOELECTRIC MATERIAL

(71) Applicant: Evident Technologies, Inc., Troy, NY (US)

(72) Inventors: Susanthri Perera, Latham, NY (US); Dave Socha, Glenmont, NY (US); Adam Z. Peng, Guilderland, NY (US); Clinton T. Ballinger, Ballston Spa, NY (US)

(73) Assignee: Evident Technologies Inc., Troy, NY (US)

( * ) Notice: Subject to any disclaimer, the term of this patent is extended or adjusted under 35 U.S.C. 154(b) by 0 days.

(21) Appl. No.: 13/866,593

(22) Filed: Apr. 19, 2013

(65) Prior Publication Data
US 2013/0280843 A1 Oct. 24, 2013

Related U.S. Application Data

(60) Provisional application No. 61/635,949, filed on Apr. 20, 2012.

(51) Int. Cl.
*H01L 21/00* (2006.01)

(52) U.S. Cl.
USPC .......... 438/54; 438/49; 438/59; 438/95; 257/40; 257/42; 257/43

(58) Field of Classification Search
None
See application file for complete search history.

(56) References Cited

U.S. PATENT DOCUMENTS

2007/0235070 A1* 10/2007 Ila .............................. 136/224

* cited by examiner

*Primary Examiner* — Kyoung Lee
(74) *Attorney, Agent, or Firm* — Hoffman Warnick LLC

(57) ABSTRACT

Herein disclosed is a method of forming a thermoelectric material having an optimized stoichiometry, the method comprising: reacting a precursor material including a population of nanocrystals with a first ionic solution and a second ionic solution to form a reacted mixture.

12 Claims, 3 Drawing Sheets

METHOD FOR A SINGLE PRECURSOR IONIC EXCHANGE TO PREPARE SEMICONDUCTOR NANOCRYSTAL N-TYPE THERMOELECTRIC MATERIAL

CROSS-REFERENCE TO RELATED APPLICATIONS

This application claims the benefit of U.S. Provisional Application Ser. No. 61/635,949, filed 20 Apr. 2012, which is hereby incorporated by reference herein.

FIELD OF THE INVENTION

Embodiments of the present invention relate generally to methods for producing n-type, colloidally grown semiconductor nanocrystals through an ionic exchange of elements.

BACKGROUND OF THE INVENTION

Thermoelectric (TE) energy conversion is a solid state technology which converts electrical energy into thermal energy or vice-versa. Thermoelectric energy is sometimes seen as a cleaner form of energy which reduces greenhouse gas emissions as compared to conventional energy generation. This technology has been used in cooling, refrigeration, and power generation. Thermoelectric energy has potential applications in waste heat recovery, for instance in automotive exhaust systems. The efficiency of this thermoelectric conversion is determined by the dimensionless property of the material called a figure of merit (ZT) which depends on the Seebeck coefficient (S), electrical conductivity ($\sigma$) and thermal conductivity (K) of the material, the equation for which is $ZT=(S^2*\sigma)/K$. For room temperature heating and cooling applications, the average ZT should be greater than approximately 1 in order to make a TE device competitive with alternative conventional technologies; hence the best TE materials can possess higher Seebeck coefficients and electrical conductivities while exhibiting lower thermal conductivities. Much research has been done since the 1990s to find an optimal material system consisting of improved intrinsic thermoelectric properties, which are lacking in most current bulk TE semiconductor materials.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

Figure 1:
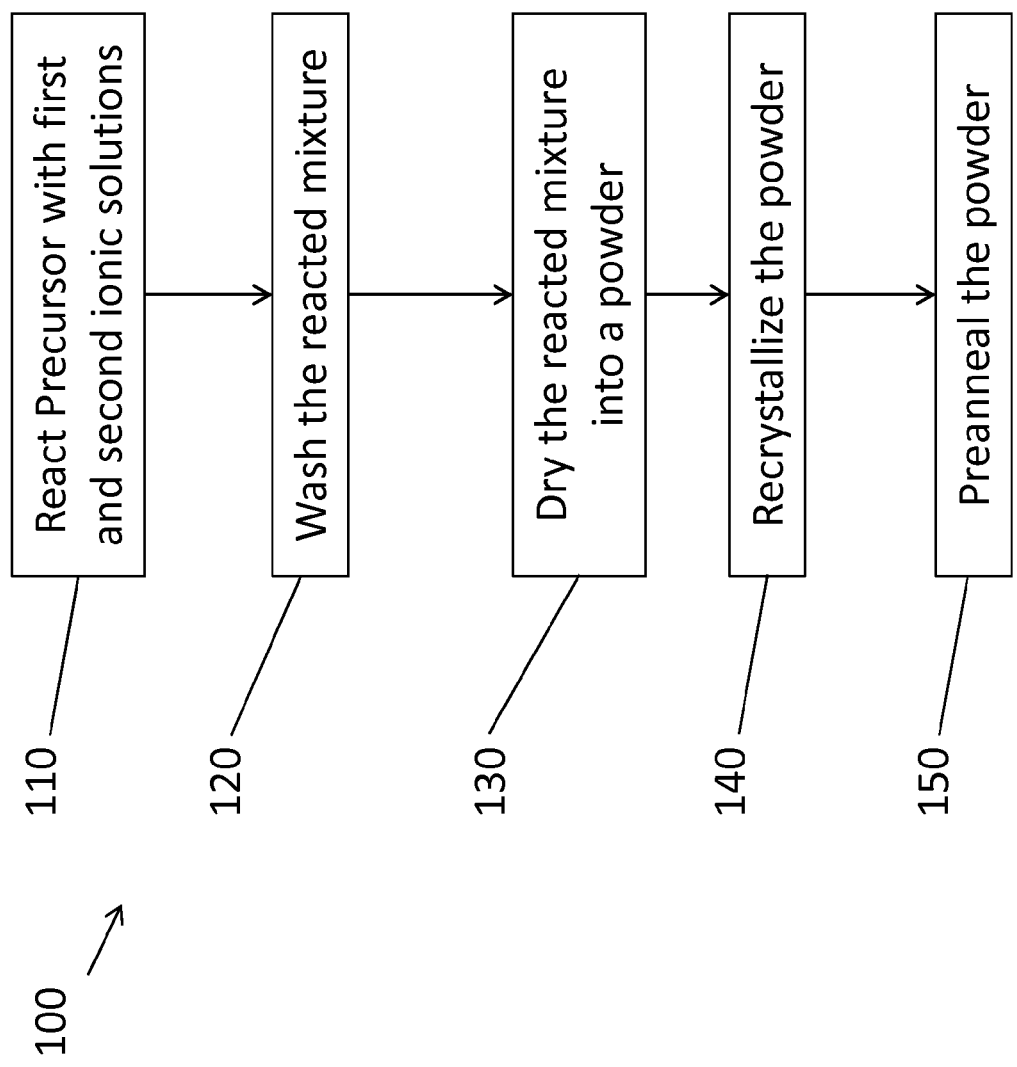
FIG. 1 shows a flow chart for a method that may include embodiments of the invention disclosed herein.

It is noted that the drawings may not be to scale. The drawings are intended to depict only typical aspects of the invention, and therefore should not be considered as limiting the scope of the invention. In the drawings, like numbering represents like elements between the drawings. The detailed description explains embodiments of the invention, together with advantages and features, by way of example with reference to the drawings.

SUMMARY OF THE INVENTION

A first aspect of the present invention includes a method of forming a thermoelectric material having an optimized stoichiometry, the method comprising: reacting a precursor material including a population of nanocrystals with a first ionic solution and a second ionic solution to form a reacted mixture.

DETAILED DESCRIPTION OF THE INVENTION

The current invention can include low dimensional semiconductor thermoelectric material systems consisting of discrete nanoparticles. These nanostructured systems can have lower thermal conductivities and higher Seebeck values than their bulk material counterparts due to both phonon scattering at the grain boundaries and quantum confinement effects of the nanocrystals. For a number of years, mixing elemental forms of thermoelectric materials to form a bulk semiconductor material system has been the standard for making TE materials. However, advances in recent years have produced other TE material systems such as skudderadites, clathrates, ball-milled bulk compounds, and some colloidally grown nanocrystal systems. Since nanocrystal systems typically use organic capping ligands to stabilize the compound, the electrical properties for these previous thermoelectric materials have shown limited promise.

According to embodiments of the current invention, a nanocrystal system can be colloidally grown so that the reaction can be terminated at any appropriate time in order to regulate the particle size of the grown nanocrystals. In such an embodiment, the longer the colloidal growth reaction is run, the larger the nanocrystals will typically be. This can allow for flexibility that has not been available in other material systems, including previous attempts at non-colloidal nanocrystal systems.

The disclosed materials and methods can incorporate an n-type element, for example selenium, into the core of the nanoparticle to improve the n-type properties of the end material, utilizing a method herein disclosed. For instance, the method disclosed in some embodiments can produce colloidally grown n-type nanocrystals, non-limiting examples of which include $Bi_2(Se,Te)_3$ and $(Bi,Sb)_2(Se,Te)_3$. In these examples, the selenium present can be considered a dopant in the core of the nanocrystals. Typical ratios in the present materials of tellurium (Te) to selenium (Se) may be approximately 15/1, illustrating that Se acts more like a dopant atom than a major component of the material.

Turning to FIG. 1, a method 100 of producing the above materials, which may be used as thermoelectric materials, is disclosed. At step 110, a precursor material may be reacted with a first ionic solution and a second ionic solution. The precursor material may include a population of nanocrystals, for instance semiconductor nanocrystals. The precursor, which may include a bismuth precursor, can be prepared separately by any known methods. For example, nanocrystals of $Bi_2S_3$ or $Bi_2Te_3$ as some example precursor materials, can be produced colloidally with effective control over the reaction kinetics. This produces a uniform distribution of nano-sized colloidal particles. However, this sulfide containing material may not be suited to be an effective thermoelectric material due to thermal loss and a low Seebeck coefficient. As such, the precursor material may be converted via an ionic exchange. In one embodiment, the precursor material will be converted to $Bi_2Se_xTe_{x-2}$.

One of the procedural steps discovered by the inventors is to find a gentle way of replacing the sulfur or similar element of the precursor material with Se, Te, or some combination of the two in the correct stoichiometric ratio while the nanoparticles remain in a suspension. In some previous embodiments, the nanocrystals will have been synthesized, separated, and possibly dried. In some embodiments of the current invention, though, the nanocrystals can remain in suspension in the solvent used to produce the nanocrystals when the ionic solutions are added. Typically, agglomeration of particles and materials falling out of solution make for an end material that contains a large number of impurity atoms. For instance, the agglomerates themselves may contain a large amount of impurities within the agglomerated particles, as the impurities may become trapped within the agglomerate. Further, it can be difficult to control the stoichiometry utilizing these previous methods.

Accordingly, still at step 110, the precursor may be introduced to the first ionic solution and the second ionic solution while in suspension. The first ionic solution and the second ionic solution can include ionic forms of tellurium and selenium, as non-limiting examples. These ionic solutions may comprise ions of the elements being added, such as the Te or Se, in a solvent. The solvent may consist of hydrazine, N-methylformamide (NMFA), or other solvents known in the art. The use of ionic solutions of the elements can eliminate the need for a second and third precursor material, as typically needed in the prior methods, for Te and Se components of the thermoelectric material. This method can lend itself to a greater scalability than using multiple precursors, as well as eliminating a number of the possible washing steps necessary in previous methods. Further, embodiments of the current invention can lead to an improved final stoichiometry of the thermoelectric material.

An improved stoichiometry or effective stoichiometry may refer to the end stoichiometry of the thermoelectric material produced compared to the target material. For instance, in many prior attempts, in making a $BiTe_3$ material, as one example, the end product may contain residual sulfur and carbon. Or, in another instance, the material may actually contain approximately 3.7 Te rather than the target 3.0 in ratio to Bi. In embodiments of the current invention, an improved stoichiometry can mean less than approximately 1000 ppm of carbon or sulfur content, or any other impurity that may be included. In a further embodiment, an improved stoichiometry may include less than approximately 500 ppm of any element not included in the target material. In another embodiment, the end stoichiometry, or ratio of atoms, should be within approximately 20% of the target. For instance, the Te in $BiTe_3$ should be between approximately 2.4 and approximately 3.6. In a further embodiment, the stoichiometry should be within approximately 10% of the target. For instance, in the above example, Te would be within approximately 2.7 and approximately 3.3. In an even further embodiment, the stoichiometry may be within approximately 5% of the desired stoichiometry.

By introducing the first ionic solution and the second ionic solution to the precursor material, the inventors have discovered a method of facilitating an ionic exchange to produce a final nanoscale material that is stoichiometrically effective and has minimal residual impurity atoms like sulfur or carbon in the final material. In addition, the thermoelectric properties are enhanced by having the Se atoms fully incorporated into the nanocrystal lattice. The thermoelectric material performance may be degraded if the Se atoms are concentrated on the outside of the nanoparticle, for example. In some embodiments, ionic exchanges with a single precursor can increase the ability to incorporate selenium into the core of the nanoparticle. For example, reacting $Bi_2S_3$ nanocrystals first with an ionic solution of Se-hydrazine, and then subsequently with an ionic solution of Te-hydrazine, can increase the incorporation of selenium into the core of the nanoparticle. Using this ionic exchange method with a single precursor can increase the thermoelectric properties of n-type materials using nanocrystals.

Further examples of creating n-type materials include, but are not limited to reacting a precursor material of $Bi_2S_3$ or $Bi_2Te_3$ nanocrystals with a variety of ionic solutions. For instance, the precursor material nanocrystals may be reacted with an ionic solution of $Sb_2Te_3$-hydrazine and an ionic solution of Se-hydrazine; an ionic solution of $Sb_2Te_3$-hydrazine and an ionic solution of $Sb_2Se_3$-hydrazine; and an ionic solution of Te-hydrazine and an ionic solution of Se-hydrazine. Further embodiments include similar methods to the above disclosed in synthesizing a p-type material. For instance, examples include but are not limited to reacting $Bi_2S_3$ nanocrystals of the first precursor material with an ionic solution of Te-hydrazine. Each of these methods can include reacting a precursor material together with ionic solvents for ionic exchange to arrive at a final optimal thermoelectric material.

At step 120, method 100 may further include washing the resulting mixture after the precursor nanocrystals have been reacted with the ionic solutions. Any known washing techniques for nanoparticles or thermoelectric materials may be utilized. In some embodiments, a wash may be used in order to remove excess sulfur and residual carbon. The wash may include a toluene wash, an Se-hydrazine wash, or any other known washes for removing excess impurities. At step 130, method 100 may include drying the reacted mixture into a powder. Examples of drying methods may include a vacuum, an inert gas overpressure system, or heating. The heating may be done in the vacuum or under pressure. At step 140 the dried powder may be recrystallized. Recrystallizing the powder may be accomplished by a separate heating, vacuum, or pressure step. However, the recrystallization may be a result of the drying process used in step 130. At step 150, the recrystallized powder may be "preannealed." The preannealing step can include similar processes used for annealing material, but done at a lower temperature, for less time, or a combination of both. For instance, the recrystallized powder may be heated at about 300° C. in order to remove surface $Sb_2Te_7^4$, sulfur, excess tellurium, and residual organic ligands (such as carbon chains) from the resulting thermoelectric material.

Figure 2:
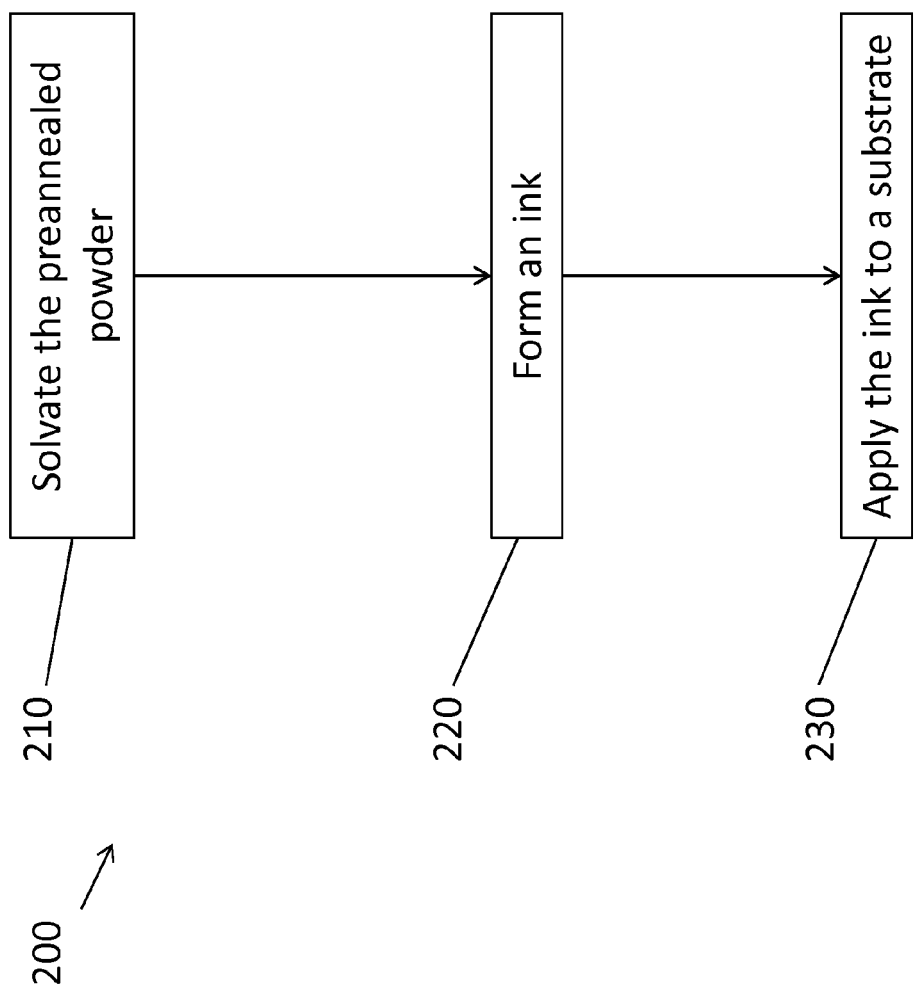
FIG. 2 shows a flow chart for a method that may include embodiments of the invention disclosed herein.

Turning to FIG. 2, further embodiments may also include a method 200 of using the preannealed material in an ink. Step 210 can include solvating the preannealed powder in a solution, such as hydrazine or ethylene diammine. Step 220 can include forming an ink. Any known ink additives may be added to the solution made at step 210. Upon forming the ink, at step 230 the ink may be applied to a substrate. The ink may be formed in such a manner that it can be sprayed, printed, or otherwise deposited onto a substrate. In some embodiments, the ink can be applied so as to produce a thin film.

Figure 3:
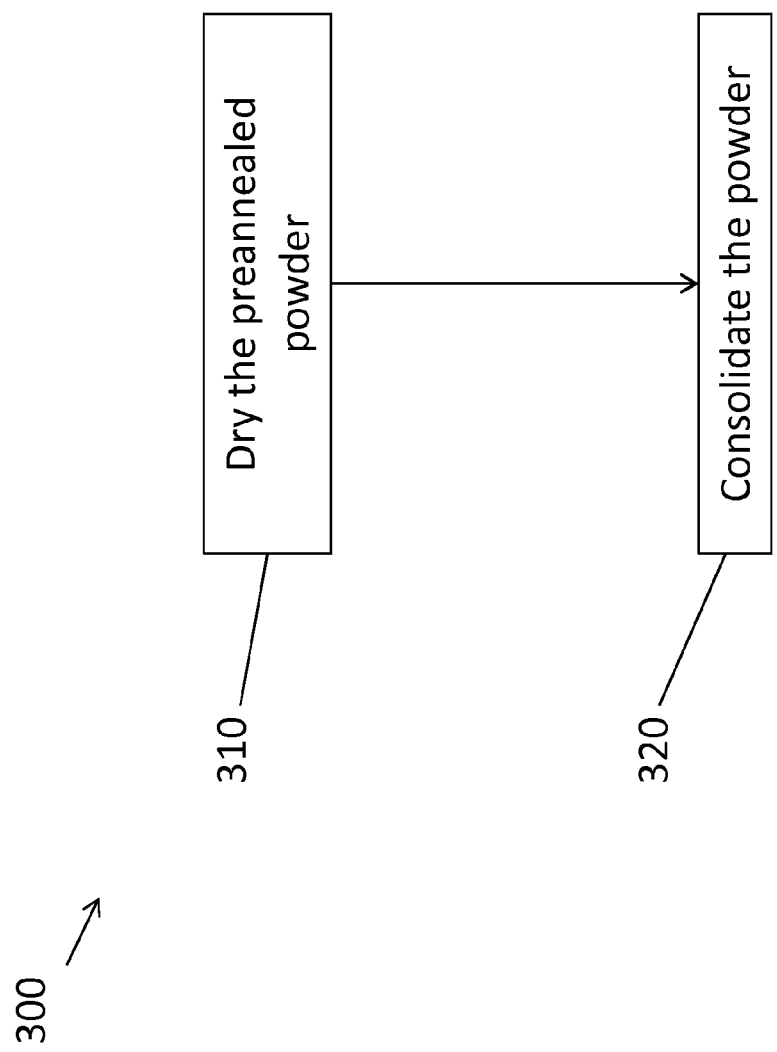
FIG. 3 shows a flow chart for a method that may include embodiments of the invention disclosed herein.

Turning to FIG. 3, the preannealed powder may be consolidated in a further method 300. For instance, at step 310, the preannealed powder may be further dried to a powder for consolidation. Drying of the preannealed powder may include any now known or later developed drying methods, including heating, a vacuum, under pressure, or any combination thereof. At step 320, the dried preannealed powder may be consolidated. Consolidation may take place using any known consolidation methods, such as cold pressing, hot-pressing, or spark plasma sintering.

In a further embodiment, the preannealed powder may be annealed, for example using heating or electrical current passage through the material. All of the above methods can result in obtaining a final material with a thermal conductivity lower than previously reported using the Bridgman technique, or other known crystal growing techniques.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed:

1. A method of forming a thermoelectric material having an optimized stoichiometry, the method comprising: reacting a precursor material including a population of nanocrystals with a first ionic solution and a second ionic solution to form a reacted mixture.

2. The method of claim 1, wherein the precursor material includes $Bi_2S_3$ nanocrystals.

3. The method of claim 2, further comprising:
washing the reacted mixture with a solution of toluene in order to remove excess sulfur.

4. The method of claim 1, wherein the first ionic solution comprises $Sb_2Te_3$-hydrazine and the second ionic solution comprises Se-hydrazine.

5. The method of claim 1, wherein the first ionic solution comprises $Sb_2Te_3$-hydrazine and the second ionic solution comprises $Sb_2Se_3$-hydrazine.

6. The method of claim 1, wherein the first ionic solution comprises Se-hydrazine and the second ionic solution comprises Te-hydrazine.

7. The method of claim 1, further comprising:
washing the reacted mixture with a solution of toluene in order to remove excess sulfur.

8. The method of claim 1, further comprising:
drying the reacted mixture utilizing a vacuum or an inert gas overpressure to form a powder; and
allowing the powder to recrystallize.

9. The method of claim 8, further comprising:
preannealing the powder at a temperature of approximately 300° C. to form a preannealed powder.

10. The method of claim 9, further comprising:
solvating the preannealed powder in hydrazine;
forming an ink; and
applying the ink to a substrate.

11. The method of claim 9, further comprising:
drying the preannealed powder; and
consolidating the preannealed powder.

12. The method of claim 9, further comprising:
annealing the preannealed powder using heat or electrical current passage through the powder.

* * * * *